US006380724B1

(12) United States Patent
Mahurin et al.

(10) Patent No.: US 6,380,724 B1
(45) Date of Patent: Apr. 30, 2002

(54) METHOD AND CIRCUITRY FOR AN UNDISTURBED SCANNABLE STATE ELEMENT

(75) Inventors: Eric W. Mahurin, Austin, TX (US); Robert C. Burd, San Jose, CA (US); Jeffrey A. Correll, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/442,208

(22) Filed: Nov. 16, 1999

(51) Int. Cl.[7] .......................... G01R 31/02; G01R 19/00
(52) U.S. Cl. ............... 324/73.1; 324/76.59; 324/76.61; 714/726; 714/729
(58) Field of Search .......................... 324/76.59, 76.61, 324/158.1, 73.1; 371/22; 714/726, 727, 729; 358/474; 712/227

(56) References Cited

U.S. PATENT DOCUMENTS

| | | | |
|---|---|---|---|
| 4,071,904 A | 1/1978 | Miller | 364/757 |
| 4,779,229 A | 10/1988 | Agrawal | 365/94 |
| 4,940,909 A | 7/1990 | Mulder et al. | 307/465 |
| 5,087,840 A | 2/1992 | Davies et al. | 307/475 |
| 5,115,191 A | 5/1992 | Yoshimori | 324/158 |
| 5,151,621 A | 9/1992 | Goto | 307/475 |
| 5,391,940 A | 2/1995 | Linn | 326/21 |
| 5,402,014 A | 3/1995 | Ziklik et al. | 326/37 |
| 5,410,267 A | 4/1995 | Haycock et al. | 326/81 |
| 5,459,736 A | * 10/1995 | Nakamura | 371/22.3 |
| 5,689,517 A | * 11/1997 | Ruparel | 371/22.3 |

FOREIGN PATENT DOCUMENTS

| EP | 0 364 925 | 4/1990 |
|---|---|---|
| EP | 0 522 413 | 1/1993 |

OTHER PUBLICATIONS

IEEE Std. 1149.1 (JTAG) Testability Primer, Texas Instrument Inc. 1996.*

"Loading Test Patterns Into Complex Semiconductor Chips Using Isolated Outboard Level Sensitive Scan Design Chains," IBM Technical Disclosure Bulletin, vol. 29, No. 3, Aug. 1986, pp. 1202–1203.

* cited by examiner

Primary Examiner—Safet Metjahic
Assistant Examiner—Paresh Patel
(74) Attorney, Agent, or Firm—Conley, Rose & Tayon, PC; Lawrence J. Merkel

(57) ABSTRACT

A method and circuitry for an undisturbed scannable state element. A scannable state element, implemented in a scan chain for testing an integrated circuit, includes both a dual-ported flop circuit and a shadow flop circuit. The dual-ported flop circuit includes both a master cell and a slave cell, while the shadow flop includes only a master cell, and utilizes the slave cell of the dual-ported flop. During scan shifting, scan data is shifted through the shadow flop and the slave cell of the dual-ported flop, bypassing the master cell. Since the data output of the dual-ported flop originates in the master cell, the state of the data in the dual-ported flop is not disturbed by the scan. Scan data may also be latched into the master cell from the scan chain or from the master cell into the scan chain through a scan data output in the slave cell. A shadow control logic circuit routes scan clock signals to either the dual-ported flop or the shadow flop, depending on whether scan shifting operations are taking place. Each shadow control logic circuit may be coupled to a plurality of shadow flops and dual-ported flops, thereby controlling a plurality of scannable state elements.

25 Claims, 7 Drawing Sheets

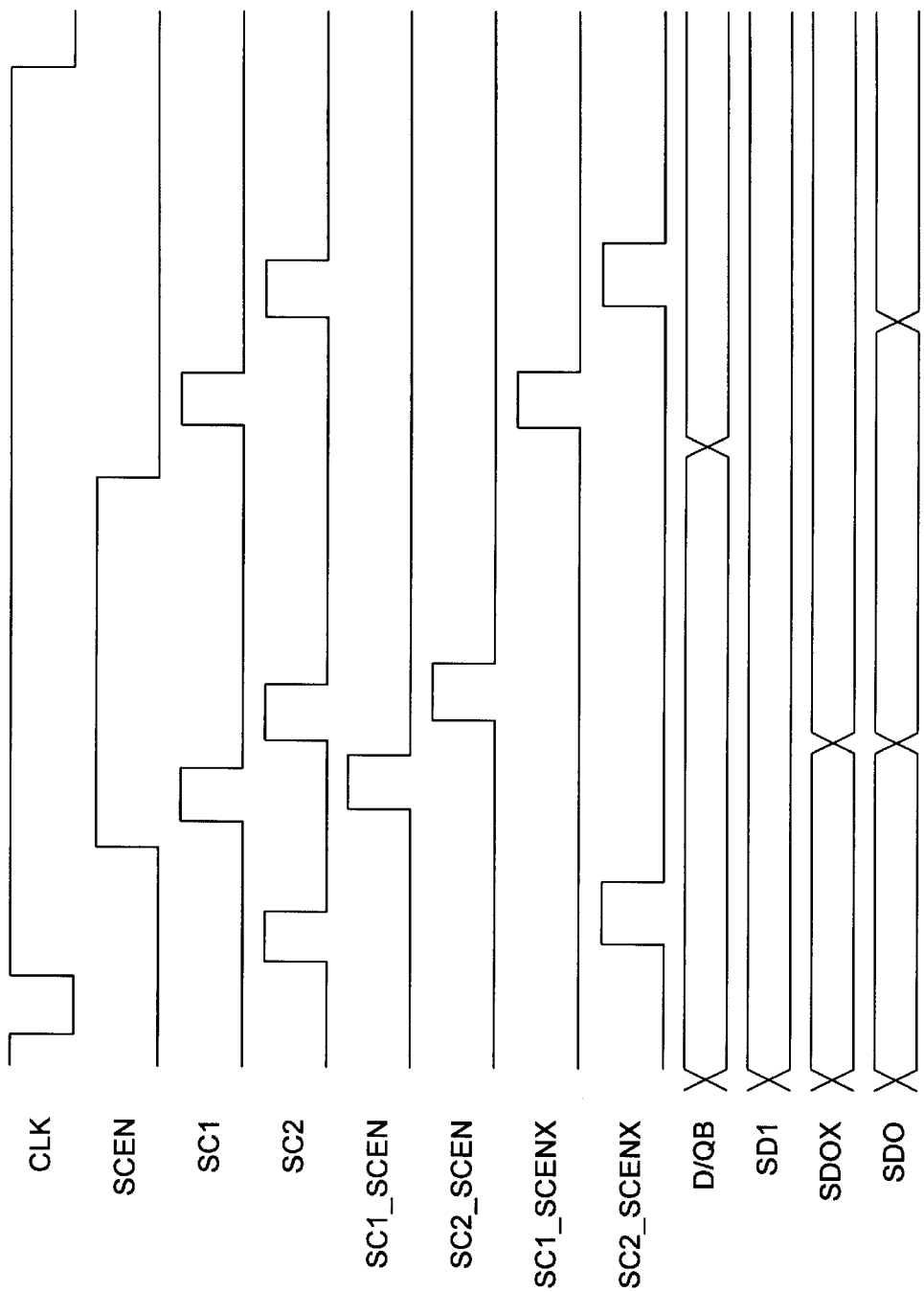

METHOD AND CIRCUITRY FOR AN UNDISTURBED SCANNABLE STATE ELEMENT

BACKGROUND OF THE INVENTION

1. Field of the Invention

This invention relates to the testing of electronic circuits, and more specifically, to circuit level testing of integrated circuits.

2. Description of the Related Art

One important aspect that must be considered in the design of any integrated circuit is testability. In recent years, design for testability has become an even greater challenge due to the ever-increasing density of integrated circuits. Because of the high density of many integrated circuits, testing their internal logic solely by applying external stimuli has become impractical. An alternate method of testing the internal logic of an integrated circuit is to use scan chains.

A scan chain is created using the flip-flops (or latches or other clocked storage devices) of an integrated circuit. The output of a given flip-flop is coupled to the input of another flip-flop. A large number of flip-flops are connected in this manner, forming a scan chain that passes through the internal logic of an integrated circuit. The scan chain may be thought of as a serial shift register, in which values are shifted from one register flop to the next. Using this method, multiple scan chains may be formed in a given integrated circuit.

In order to test an integrated circuit using a scan chain, scan data (i.e. the test data, or test vector) is shifted into the chain, loading each element of the chain with a predetermined value. Following the initial loading, the circuit is then reverted to its normal operating mode, allowing the individual circuits to respond to the scan data. After allowing the circuits a sufficient time to respond, the scan data is shifted out of the scan chain, where it is compared with expected results to determine whether the chip is faulty.

One common type of flip-flop (or latch) circuit used in the formation of scan chains is the dual-ported flop. A dual-ported flop possesses both a data input and a scan data input, as well as a data output and a scan data output. In addition to the system clock input, a dual-ported flop also may include two scan clock inputs. One scan clock is used to load scan data into the flop, while the other is used to shift data out of the flop.

Despite the advantages provided by testing through scan chains, problems can arise when shifting scan data through the chain. One such problem arises when the state of a flop data output is disturbed during scan shifting. Scanning scan data through the flop can cause arbitrary changes in the state of the flop's data output. Such state changes can have undesired effects and may even cause damage to the circuit FIG. 1 is a schematic of a one-hot multiplexer circuit (or passgate multiplexer circuit), and is used to illustrate a potential problem that can occur during scan shifting. The logic surrounding the one-hot multiplexer is designed so that only one of the three select inputs (S0, S1, or S2) is asserted at any given time. However, during scan shifting, a state change in a flop output may override the surrounding logic, causing two or more select inputs to be asserted at the same time. This can result in excess current being drawn from the output inverter. The excess current may damage or destroy the output inverter.

Problems such as the above example can force compromises in the design of an integrated circuit, compromise its testability, or both. For example, the problem illustrated above may be prevented by using traditional multiplexer circuits at the cost of using more circuit area to implement the same function. Alternatively, testing sequences can be designed to avoid these areas of the circuit, compromising its testability.

SUMMARY OF THE INVENTION

The problems outlined above are in large part solved by a method and circuitry for an undisturbed scannable state element. In one embodiment, the scannable state element includes a dual-ported level sensitive scan design (LSSD) style flop/latch circuit which is augmented with a shadow flop circuit. The dual-ported flop circuit includes both a master cell and a slave cell. A shadow flop circuit is coupled to the dual-ported flop circuit. The shadow flop circuit includes a master cell, and utilizes the slave cell of the dual-ported flop circuit. During scan operations, the scan data bypasses the master cell of the dual-ported flop, passing instead through the shadow flop circuit and the slave cell of the dual-ported flop. Scan data is then passed on to the next link in the scan chain through a scan data out (SDO) output coupled to the slave cell. Since, during scan, the scan data bypasses the master cell of the dual-ported flop (to which the data output of the flop is coupled), the state of the flop remains unchanged. Thus, the data output of the dual-ported flop is held steady, which may allow any circuit constraints to be met during the scan.

Control of scan operations, in one embodiment, is accomplished through the use of a shadow control logic circuit. The shadow control logic is configured to receive two clock inputs (scan clock one, or SC1, and scan clock two, or SC2), and a scan enable input. When the scan enable input is asserted, the two scan clock inputs may be used to latch scan data through the shadow flop, thus bypassing the master cell of the dual-ported flop. As a result, the state of the dual-ported flop may not be disturbed. If the scan enable input is not asserted, the two scan clock inputs may be used to load a predetermined state into the master cell of the dual-ported flop and shift data out of the flop for observation upon completion of the test. Each shadow control logic circuit can be used to control a plurality of shadow/dual-ported flop circuit combinations.

Thus, in various embodiments, the method and circuitry of a scannable state element allows scan operations to take place without disturbing the state of the dual-ported flop circuit During scan operations, scan data bypasses the master cell of the dual-ported latch circuit, passing through the shadow flop circuit instead. Since the state of the dual-ported flop circuit is not disturbed during the scan, the scannable state element may be able to meet the constraints of the circuitry under test, thus allowing greater testability without compromising circuit design. Since the shadow flop utilizes the slave cell of the dual-ported flop, shadow flop and shadow control circuitry may be implemented in designs containing dual-ported flops.

BRIEF DESCRIPTION OF THE DRAWINGS

Other objects and advantages of the invention will become apparent upon reading the following detailed description and upon reference to the accompanying drawings in which:

FIG. 8 is a timing diagram for illustrating the operation of one embodiment of the invention, as shown in FIG. 7.

Figure 1:
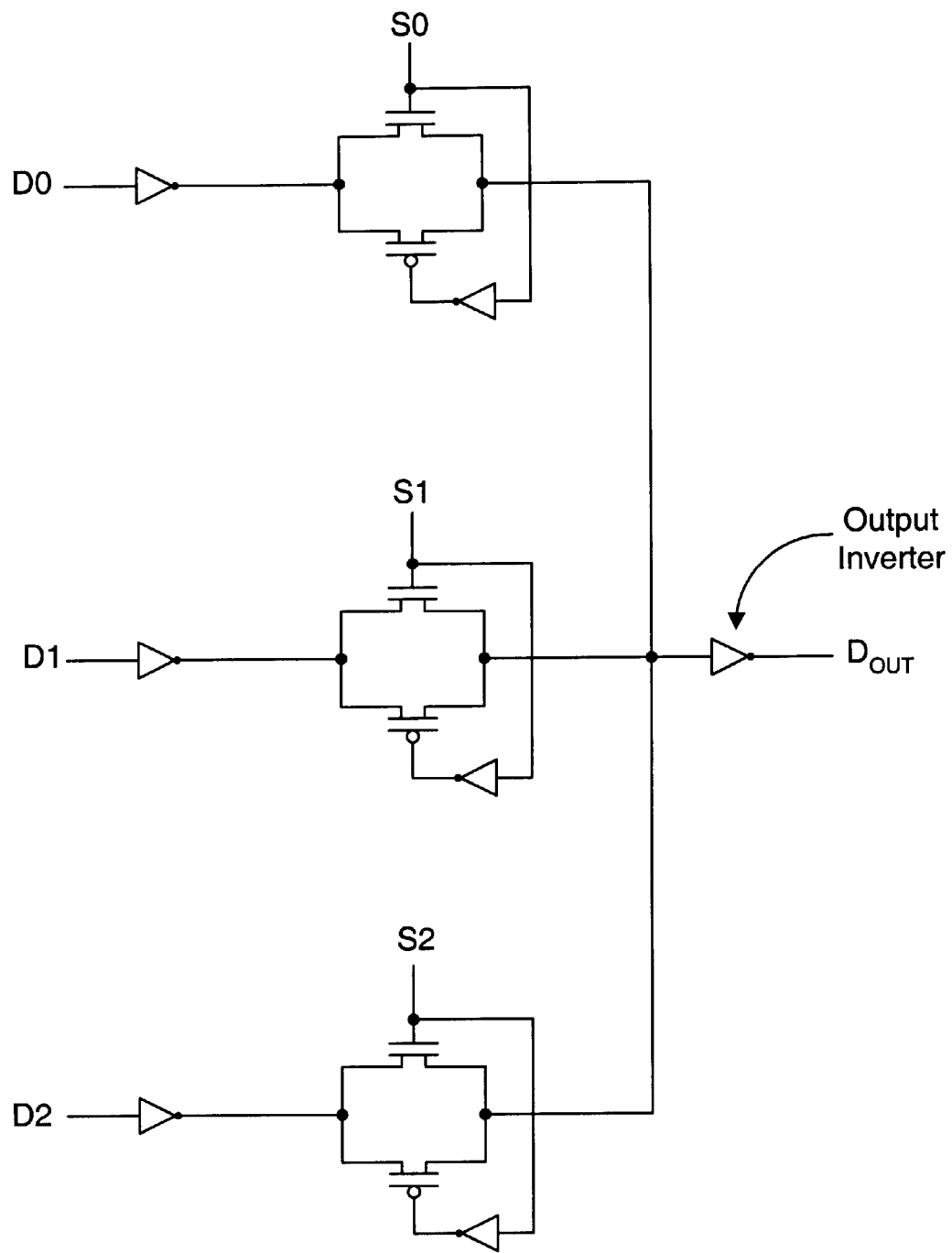
FIG. 1 is a schematic of a one-hot multiplexer circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scoped of the present invention as defined be the appended claims.

DETAILED DESCRIPTION OF THE INVENTION

Figure 2:
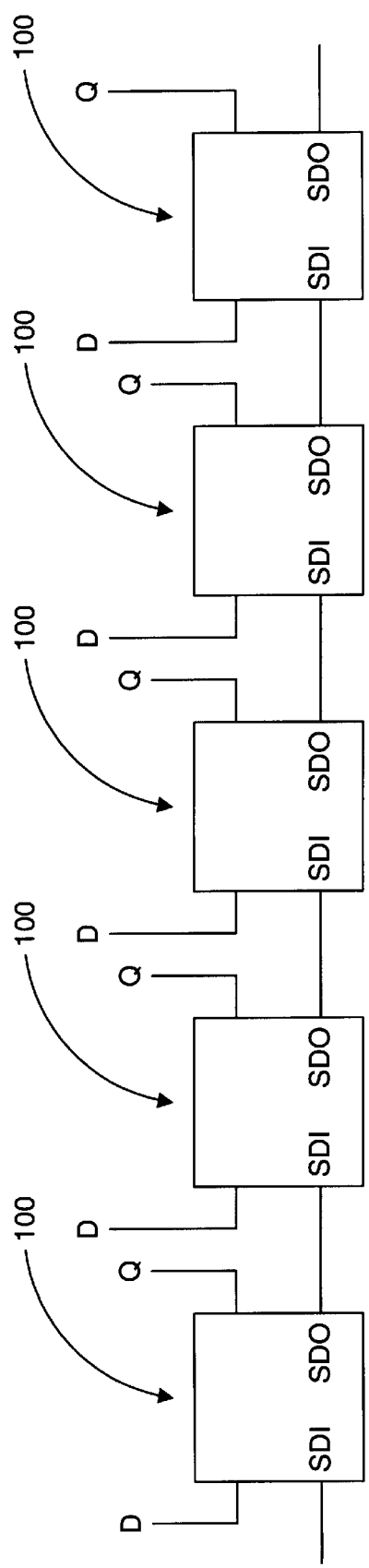
FIG. 2 is a diagram of one embodiment of a chain of scannable state elements in which scan data may be shifted through the circuit under test.

Turning now to FIG. 2, a diagram of one embodiment of a chain of scannable state elements in which scan data may be shifted through the circuit under test is shown. A plurality of scannable state elements 100 are chained together by coupling the scan data out (SDO) output of one scannable state element to the scan data in (SDI) input of the next scannable state element. The data input, D, and data output, Q, of each scannable state element 100 are coupled to other logic elements of the integrated circuit. In order to test the integrated circuit, a test vector including of a plurality of individual data bits is serially shifted into each of the scannable state elements 100 through the SDI and SDO ports. Subsequent to the shift, the state of each scannable state element 100 is loaded through the SDI input, setting the data output Q to a known state. The integrated circuit is then returned to a normal operating state, allowing the surrounding circuits to respond to the scan data Responding to the scan data may cause the state of individual scannable state elements to change, depending on the surrounding circuitry and the design of the test Once the circuitry has been given sufficient time to respond to the test vector, scanning is resumed. The modified test vector is shifted out of the integrated circuit where it is observed and a determination is made as to whether the circuit is faulty or not.

Generally, a scannable state element may be any clocked storage device having scan functionality. Flip-flops, latches, registers, or other devices may be used to implement a scannable state element.

Figure 3:
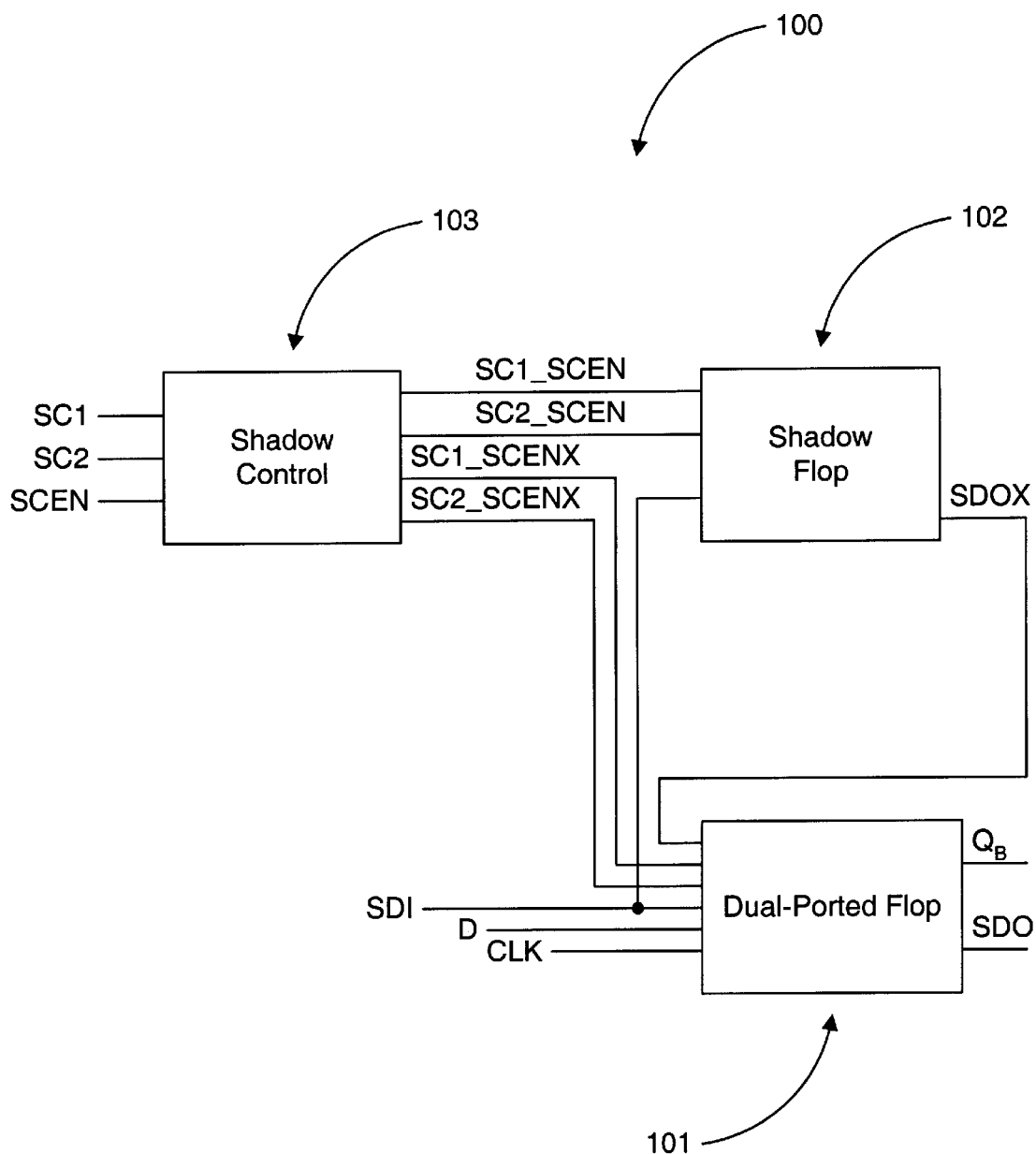
FIG. 3 is a block diagram of one embodiment of a scannable state element.

Moving on to FIG. 3, a block diagram of one embodiment of a scannable state element 100 is shown. Scannable state element 100 includes a dual-ported flop circuit 101, a shadow flop circuit 102, and a shadow control logic circuit 103. Shadow control logic circuit 103 is configured to receive two scan clock signals, SC1, and SC2, as well as a scan enable (SCEN) signal. Shadow control logic circuit 103 can drive one of four different clock signals to either the shadow flop circuit 102 or the dual-ported flop 101. During scan shifting, shadow control logic circuit 103 drives clock signals SC1_SCEN and SC2_SCEN to shadow flop circuit 102. Clock signal SC1_SCENX is driven to the dual-ported flop circuit 101 to load it with a designated state, while clock signal SC2_SCENX is driven to dual-ported flop circuit in order to latch the flop state to the SDO output.

Shadow flop circuit 102, as stated above, is configured to receive scan clock signals SC1_SCEN and SC2_SCEN. Shadow flop circuit 102 is also includes an SDI input for receiving scan data signals. Scan data signals are driven out of shadow flop circuit 102 to the dual-ported flop circuit 101 through the SDOX output. In some embodiments, the signal driven through the SDOX output may be a complement of the signal received through the SDI port. In such cases, the signal is re-inverted to its original state prior to being driven through the SDO output of dual-ported flop circuit 101. In other embodiments, the signal is not inverted.

Dual-ported flop circuit 101 is configured to receive both data signals and scan data signals through inputs D and SDI, respectively. Dual-ported flop circuit 101 is also configured to receive three clock signals: CLK, SC1_SCENX, and SC2_SCENX. The clock signal received at the CLK input is the system clock signal, and is used during normal circuit operations. As described above, clock signals SC1_SCENX and SC2_SCENX are used to latch data within the flop. Dual-ported flop circuit 101 also has a second input, SDOX, for receiving scan data signals. During scan shifting operations, dual-ported flop circuit 101 does not receive scan data signals through the SDI input. Instead, scan data signals bypass the master cell of dual-ported flop circuit 101(to be explained in further detail below) and are driven through shadow flop circuit 102. These signals are then driven to dual-ported flop circuit 101 through the SDOX input. Dual-ported flop circuit 101 also has two output ports, $Q_B$ and SDO. During normal operations, data signals are driven from dual-ported flop circuit 101 through $Q_B$. When scan-shifting operations are in progress, scan data signals are driven from dual-ported flop circuit 101 through the SDO port.

Figure 4:
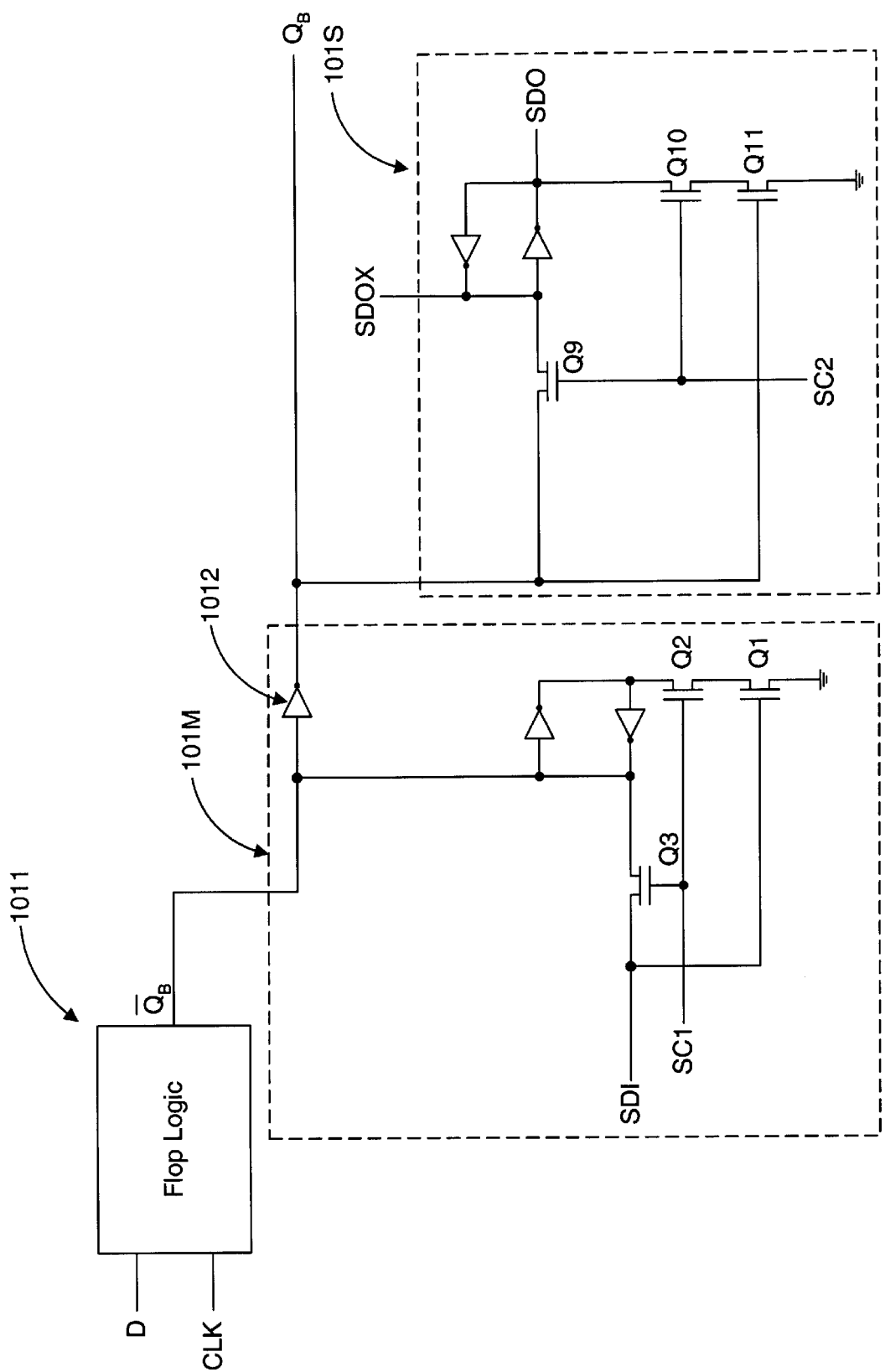
FIG. 4 is a schematic of one embodiment of a dual-ported flop circuit.

Turning next to FIG. 4, a schematic of one embodiment of a dual-ported flop circuit 101 is illustrated. Flop logic 1011 may be either a latch or an edge-triggered flip-flop. The embodiment shown is for a D-type flip-flop/latch and is configured to receive a data signal at input D, as well as a clock signal at input CLK. In this embodiment, the complement of the data signal is driven through $Q_B$-bar although alternate embodiments may take the uncomplemented data signal as an output. The dual-ported flop circuit 101 also includes a master cell 101M and a slave cell 101S. Master cell 101M is configured to receive scan data signals through input SDI and scan clock signals through input SC1. When a clock pulse is asserted at SC1, transistor Q3 is activated, thereby passing the data signal present on SDI into master cell 101M. The data signal can then be driven to the slave cell 101S, or flop output $Q_B$ through inverter 1012.

In addition to the data input from the master cell, slave cell 101S is configured to receive a scan data signal through input SDOX and a scan clock signal through input SC2. Slave cell 101S is configured to drive scan data signals through output SDO. Data signals received from master cell 101M may also be driven through the SDO output when a clock pulse is asserted on the SC2 input. When the clock pulse is asserted at SC2, transistor Q9 is activated, thereby passing the data signal into the slave cell from the master cell.

Figure 5:
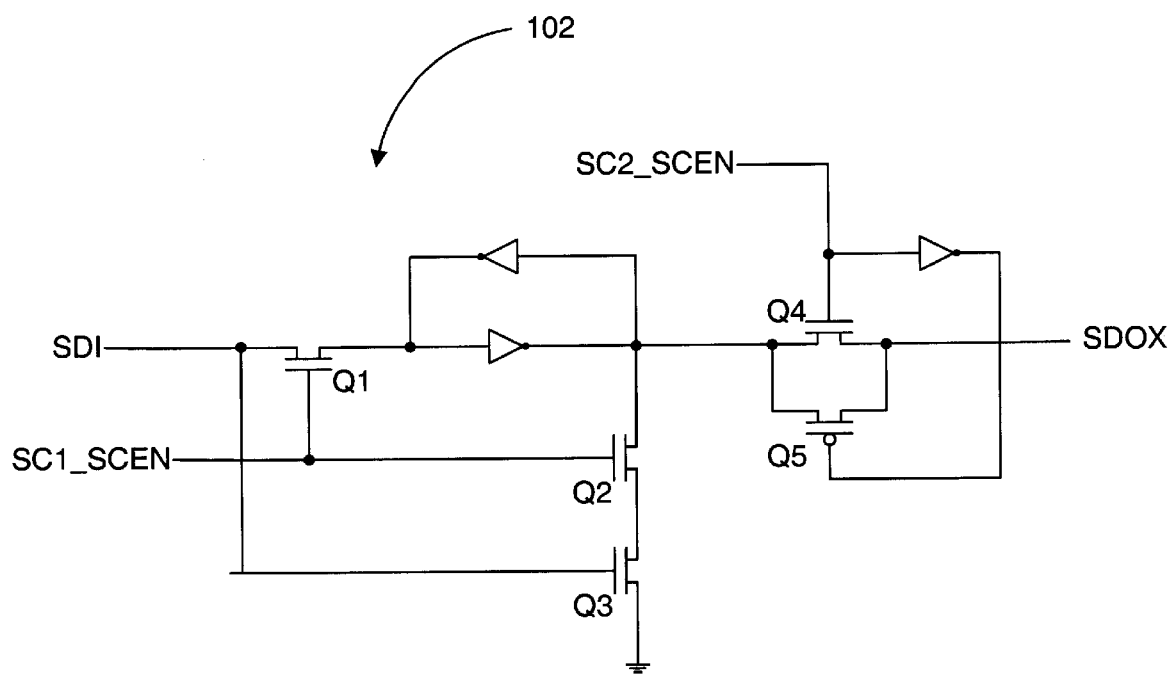
FIG. 5 is a schematic of one embodiment of a shadow flop circuit.

Turning now to FIG. 5 a schematic of one embodiment of shadow flop circuit 102 is shown. Shadow flop circuit 102 is configured to receive a scan data signal through input SDI, and two scan clock signals through inputs SC1—SCEN and SC2_SCEN respectively. Scan data signals are driven by shadow flop circuit 102 through output SDOX. During scan-shifting operations, a clock pulse received at input SC1_SCEN activates transistor Q1, passing the scan data signal into the flop. When a clock pulse is received at input SC2_SCEN, transistors Q4 and Q5 are activated and the scan data signal is then driven to the SDOX output.

Figure 6:
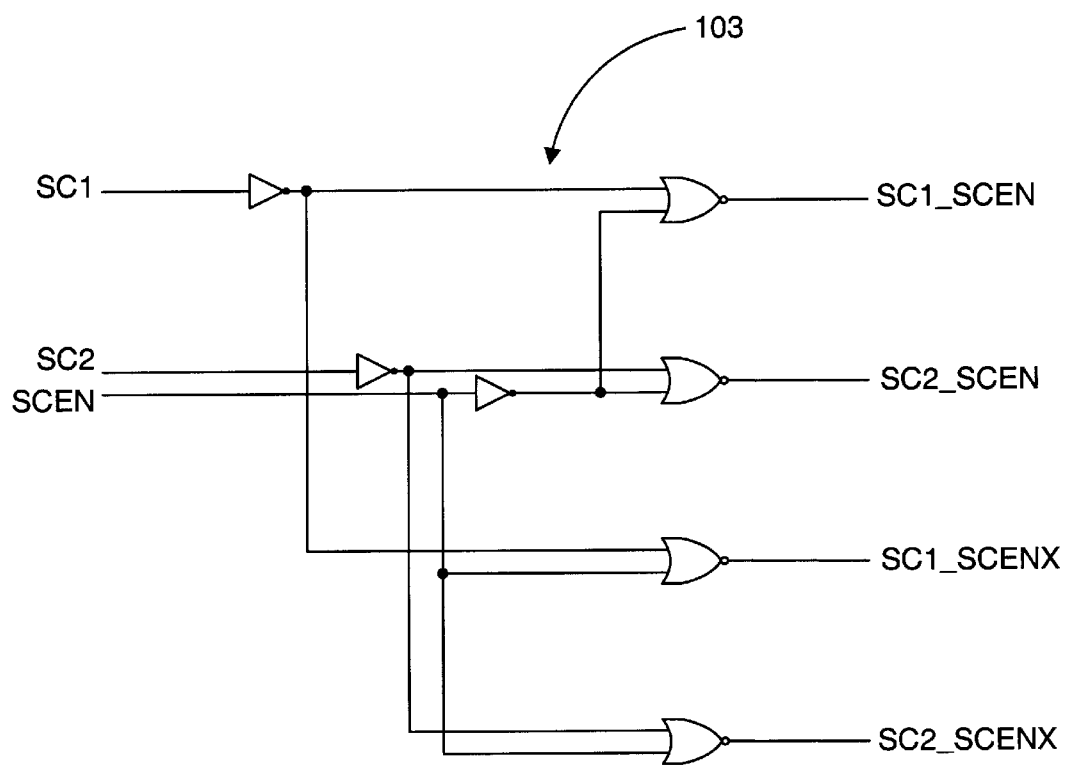
FIG. 6 is a schematic of one embodiment of a shadow control logic circuit.

FIG. 6 is a schematic of one embodiment of a shadow control logic circuit 103. Shadow control logic 103 is configured to receive a scan enable (SCEN) signal, and two scan clock signals (SC1 and SC2). Shadow control logic circuit 103 is configured to drive four output clock signals through outputs SC1_SCEN, SC2_SCEN, SC1_SCENX and SC2_SCENX. Two of these clock signals may be driven to a shadow flop circuit 102 through outputs SC1_SCEN and SC2_SCEN when the scan enable signal is asserted on the SCEN input and clock pulses are received on the corresponding inputs. If the scan enable signal is not asserted, clock signals may be driven to a dual-ported flop circuit 101 through outputs SC1_SCENX and SC2_SCENX when input clock signals are received on the corresponding inputs. A single shadow control logic circuit 103 may control a plurality of shadow/dual-ported flop circuit combinations.

Figure 7:
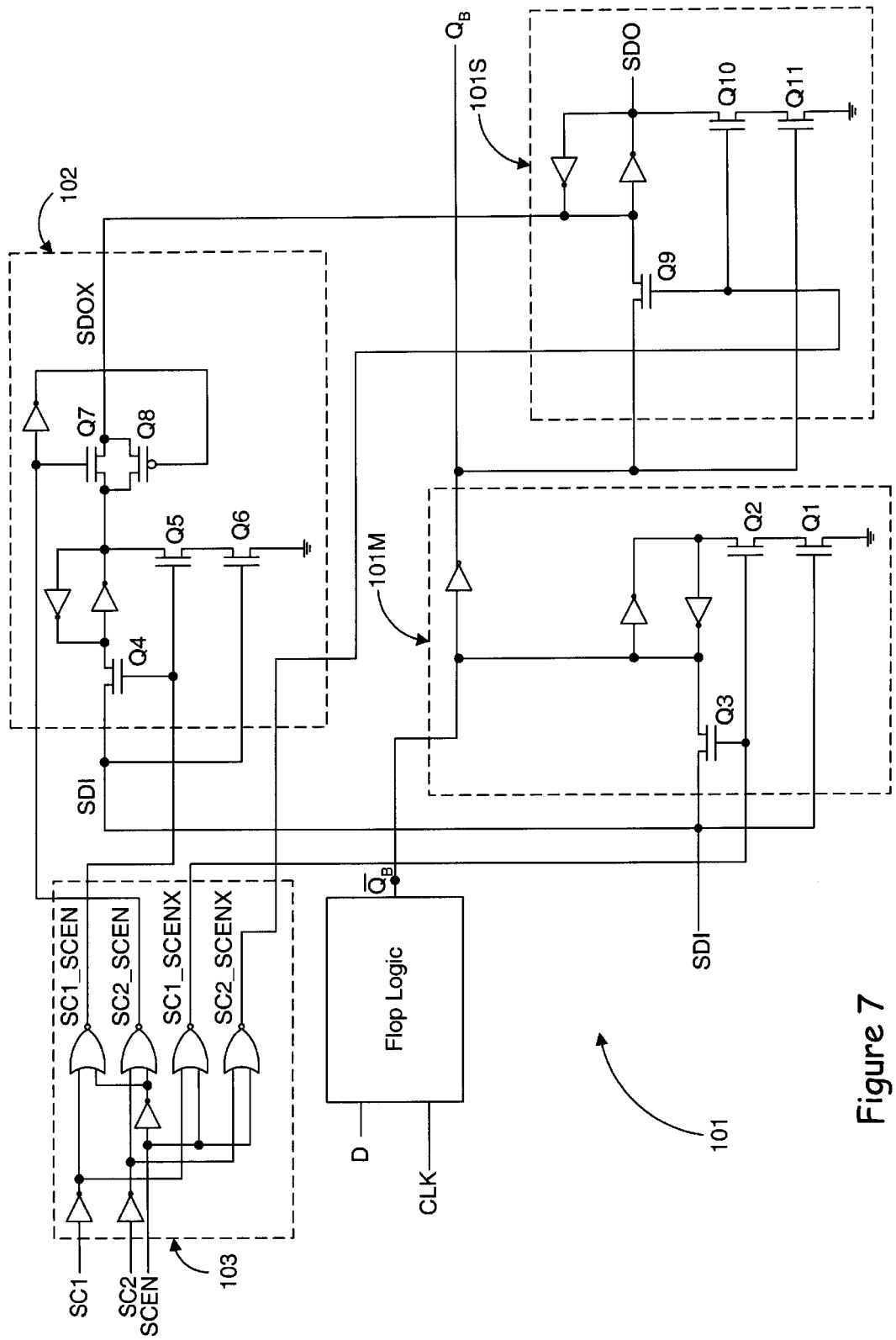
FIG. 7 is a schematic of one embodiment of a scannable state element, including the shadow control logic circuit, the shadow flop, and the dual-ported flop circuit.

Moving now to FIG. 7, a schematic of one embodiment of the scannable state element 100, including the shadow control logic circuit 103 of FIG. 6, the shadow flop circuit 102 of FIG. 5, and the dual-ported flop circuit 101 of FIG. 4 is illustrated. Shadow control circuit 103 is coupled to both shadow flop circuit 102 and dual-ported flop circuit 101, as shown in FIG. 3. Dual-ported flop circuit 101 is shown as including a master cell 101M, and a slave cell, 101S. In the embodiment shown, shadow flop circuit 102 does not include a slave cell, but instead utilizes the slave cell 101S of the dual-ported flop. Dual-ported flop circuit 101 includes logic for a D-type latch in this embodiment. Other types of circuits may be used in alternate embodiments, such as edge-triggered flip-flops, or other types of clocked storage device.

During the shifting in or out of a test vector, the CLK input of the dual-ported flop is held in a known state. Scan shifting can then commence once the scan enable signal is asserted on SCEN input of shadow control logic 103. When the scan enable signal is asserted, output signals from the SC1_SCENX and SC2_SCENX inputs are held in a low state, causing transistors Q3 and Q9 to remain off. By keeping these two transistors deactivated, scan data passing through the scan chain is isolated from the data output $Q_B$ of the dual-ported flop. Consequently, the state of the data output from the dual-ported flop is not disturbed by the scanning in or out of scan data.

Instead of passing through the master cell 101M of the dual-ported flop circuit 101, and possibly disturbing the flop state, scan data instead is passed through shadow flop circuit 102. With a scan enable signal asserted on the SCEN input and the receipt of a clock pulse on the SC1 input, the shadow control logic drives a corresponding clock pulse through the SC1_SCEN output, activating Q4 for the duration of the pulse. Activating Q4 allows the data signal present on the SDI input to be loaded into shadow flop 102. Once loaded, the data is held even after Q4 is deactivated. When a clock pulse is received at the SC2 input of shadow control logic 103, a corresponding clock pulse is driven through output SC2_SCEN. Transistors Q7 and Q8 are activated in response to this clock pulse, and the scan data signal is then driven to the slave cell 101S, and subsequently driven through the SDO output of the dual-ported flop. It should be noted that the inverters shown in the schematic, which complement the various signals, are not required, but rather, are a feature of this particular embodiment.

Shadow control logic circuit 103 may also cause dual-ported flop circuit 101 to be loaded with a predetermined state, as well as having the flop data state (i.e. the signal state of $Q_B$) loaded into the scan chain. For either of these events to occur, the CLK input may be held to a known state, and the scan enable signal on the SCEN input is de-asserted. With the scan enable signal de-asserted, a clock pulse received on the SC1 input of shadow control logic circuit 103 drives a corresponding clock signal on the SC1_SCENX output, which activates transistor Q3. With Q3 activated, a data signal present at the SDI input of the dual-ported flop is loaded into the master cell, setting its state. To load the current state of the flop into the scan chain, transistor Q9 is activated. This occurs when a clock pulse is received on the SC2 input of shadow control logic 103 while the scan enable signal is de-asserted.

FIG. 8 is a timing diagram that further illustrates the operation of the scannable state element illustrated in FIG. 7. Prior to the beginning of scan operations, the system clock signal, CLK, will cycle between high and low states as normal. In order for any scan operations to take place CLK is held in a known state, asserted high in this embodiment After the clock is asserted high and held, a scan clock pulse is received on the SC2 input, asserting the SC2_SCENX signal (since SCEN is still held low), allowing data from the flop to be latched into the slave cell 101S. A scan enable signal, SCEN, is then asserted to begin the scanning. With the scan enable signal asserted, receipt of a clock pulse at the SC1 input causes the shadow control logic circuit 103 of FIG. 7 to drive a corresponding clock pulse on the SC1_SCEN output. This results in the loading of scan data into the shadow flop circuit 102. The first clock pulse (received at SC1_SCEN) then falls. A second clock pulse is then received on the SC2 input of shadow control logic circuit 103. This results in shadow control logic circuit 103 driving a corresponding clock pulse on the SC2_SCEN output, causing shadow flop circuit 102 to drive loaded scan data from to the slave cell 101S of dual-ported flop circuit 101. Slave cell 101S then drives the scan data signal to the next element of the scan chain through the SDO output.

When the scan enable signal is de-asserted (with CLK still held high), a clock pulse received at the SC1 input of shadow control logic circuit 103 causes a corresponding clock pulse to be driven through the SC1_SCENX output. The data signal present at the SDI input of the dual-ported flop is then loaded into the flop, setting its state. The state of the dual-ported flop may also be loaded into the scan chain for shifting out test results. When a clock pulse is asserted at the SC2 input of shadow control logic circuit 103, a corresponding clock pulse is driven at the SC2_SCENX output. This results in the loading of the current data state of the dual-ported flop circuit 103 (i.e. the state of the data output) to the to slave cell 101S. The data signal may then be driven through the SDO output and shifted through the scan chain.

The timing diagram of FIG. 8 also illustrates how scan data may pass through the scannable state element without disturbing the data output of the dual-ported flop. Upon assertion of the SC2 signal, the SC2_SCEN signal is asserted and the scan data in the shadow flop circuit is allowed to pass through, which may cause the SDOX and SDO signals to change state. Since the scan data output (SDO) of the scannable state element is electrically separate from the data output ($Q_B$) of the dual-ported flop, the state of the data output may remain undisturbed as scan data passes through.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A scannable state element circuit comprising:
   a first storage circuit configured to receive a data input signal and a scan data input signal, and drive a data output signal and a first scan data output signal;
   a second storage circuit coupled to said first storage circuit, said second storage circuit configured to receive said scan data input signal and drive a second scan data output signal to said first storage circuit, the first storage circuit being coupled to the second scan data output signal; and,
   a control circuit coupled to said first storage circuit and said second storage circuit, said control circuit configured to receive one or more scan clock signals and a scan enable signal, and wherein said control circuit is responsive to said scan enable signal and said one or more scan clock signals to cause scan data received via the scan data input signal to pass through said second storage circuit to said first storage circuit via said second scan data output signal without changing a state of said data output signal of said first storage circuit.

2. The scannable state element circuit as recited in claim 1, wherein said control circuit is configured to control a plurality of first storage circuits including said first storage circuit and a plurality of second storage circuits including said second storage circuit.

3. The scannable state element circuit as recited in claim 1, wherein said control circuit is configured to drive scan clock signals to said second storage circuit in response to an assertion of said scan enable signal.

4. The scannable state element circuit as recited in claim 1, wherein said control circuit is configured to drive scan clock signals to said first storage circuit in response to a de-assertion of said scan enable signal.

5. The scannable state element circuit as recited in claim 4, wherein a state is loaded into said first storage circuit in response to a first scan clock signal from said control circuit.

6. The scannable state element circuit as recited in claim 5, wherein a state of said first storage circuit is observed by driving said scan data output signal in response to a second scan clock signal from said control circuit.

7. The scannable state element circuit as recited in claim 1, wherein said first storage circuit includes a first master cell and a slave cell, said first master cell configured to drive said data output signal and said slave cell configured to drive said first scan data output signal.

8. The scannable state element circuit as recited in claim 7, wherein said second storage circuit includes a second master cell configured to drive said second scan data output signal.

9. The scannable state element circuit as recited in claim 8, wherein said second scan data output signal is coupled to said slave cell, and wherein said control circuit is configured to cause said slave cell to store said second scan data output signal in response to a second scan clock signal from said control circuit.

10. The scannable state element circuit as recited in claim 1, wherein said first storage circuit is a level-sensitive scan design (LSSD) flop circuit.

11. A method of scanning scan data through a scan chain comprising:
    setting a first storage circuit to a first state, said first storage circuit having both a data output and a scan data output;
    driving a scan data signal to a scan data input, said scan data input coupled to both said first storage circuit and a second storage circuit;
    driving a first scan clock signal to said second storage circuit;
    loading said scan data signal into said second storage circuit in response to said first clock signal;
    driving a second scan clock signal to said second storage circuit; and,
    driving said scan data signal to said scan data output of said first storage circuit, wherein said first state of said first storage circuit remains unchanged during said scanning of scan data through a scan chain, and, wherein said driving said scan data signal to said scan data output of said first storage circuit is responsive to said driving a second scan clock signal to said second storage circuit.

12. The method as recited in claim 11, wherein said driving said a first scan clock signal and said driving a second scan clock signal is responsive to an assertion of a scan enable signal.

13. The method as recited in claim 12, further comprising latching said scan data signal from said second storage circuit into a slave cell of said first storage circuit.

14. The method as recited in claim 11, further comprising:
    driving a third clock signal to said first storage circuit;
    storing said scan data signal in said first storage circuit in response to said driving a third clock signal to said first storage circuit;
    driving a fourth clock signal to said first storage circuit; and,
    driving a data signal to said scan data output of said first storage circuit in response to said driving a fourth clock signal to said first storage circuit.

15. The method as recited in claim 14, wherein said driving a third clock signal and said driving a fourth clock signal is responsive to a de-assertion of a scan enable signal.

16. A scannable state element circuit comprising:
    a first storage circuit configured to receive a data input signal and a scan data input signal, and drive a data output signal and a first scan data output signal;
    a second storage circuit coupled to the first storage circuit, the second storage circuit configured to receive the scan data input signal and drive a second scan data output signal to said first storage circuit, wherein the first storage circuit is coupled to the second scan data output signal; and
    a control circuit coupled to the first storage circuit and the second storage circuit, the control circuit configured to receive one or more scan control signals and a scan enable signal, and wherein the control circuit is responsive to the scan enable signal and one or more scan control signals to cause scan data received via the scan data input signal to pass through the second storage circuit to the first storage circuit via said second scan data output signal without changing the state of the data output signal of the first storage circuit.

17. The scannable state element circuit as recited in claim 16, wherein the first storage circuit is configured to drive the data output signal on a first circuit line which is electrically separate from a second circuit line upon which the first scan data output signal is driven.

18. The scannable state element circuit as recited in claim 16, wherein the control circuit is configured to control a plurality of circuits identical to the first storage circuit, including the first storage circuit, and a plurality of circuits identical to the second storage circuit, including the second storage circuit.

19. The scannable state element circuit as recited in claim 18, wherein the first storage circuit includes a first master cell and a slave cell, wherein the first master cell is configured to drive the data output signal and the slave cell is configured to drive the first scan data output signal.

20. The scannable state element circuit as recited in claim 19, wherein the second storage circuit includes a second master cell configured to drive the second scan data output signal.

21. The scannable state element circuit as recited in claim 20, wherein the second master cell is configured to drive the second scan data output signal to the slave cell.

22. A method of scanning data through a scan chain, the method comprising:
    setting a data output of a first storage circuit to a first state, the first storage circuit having the data output and a scan data output, wherein the data output and the scan data output are electrically separate;
    driving a scan data signal to a scan data input, the scan data input coupled to both the first storage circuit and the second storage circuit;
    driving a first scan control signal to the second storage circuit;
    loading the scan data signal into the second storage circuit responsive to the second storage circuit receiving the first scan control signal;
    driving a second scan control signal to the second storage circuit; and
    driving the scan data signal to the scan data output of the first storage circuit, wherein the first state of the data output of the first storage circuit remains unchanged during the scanning of scan data through a scan chain, and wherein said driving the scan data signal to the scan data output of the first storage circuit is responsive to said driving the second scan control signal to the second storage circuit.

23. The method as recited in claim 22 further comprising a control circuit controlling a plurality of circuits identical to the first storage circuit, including the first storage circuit, and a plurality of circuits identical to the second storage circuit, including the second storage circuit.

24. The method as recited in claim 22 further comprising latching the scan data from the second storage circuit into a slave cell of the first storage circuit.

25. The method as recited in claim 22 further comprising:
    driving a third scan control signal to the first storage circuit;
    storing a state of the scan data signal in the first storage circuit responsive to said driving the third scan control signal to the first storage circuit;
    driving a fourth scan control signal to the first storage circuit; and
    driving a data signal to the scan data output of the first storage circuit responsive to said driving the fourth scan control signal to the first storage circuit.

* * * * *